United States Patent [19]

Micheron et al.

[11] Patent Number: 4,818,857

[45] Date of Patent: Apr. 4, 1989

[54] ELECTROSTATIC IMAGE SENSOR HAVING AN ELECTRET WHICH POLARIZES A PHOTOCONDUCTIVE LAYER

[75] Inventors: Francois Micheron, Gif sur Yvette; Dominique Broussoux, Marcoussis, both of France

[73] Assignee: Thomson-CSF, Paris, France

[21] Appl. No.: 106,262

[22] Filed: Oct. 9, 1987

[30] Foreign Application Priority Data

Oct. 10, 1986 [FR] France ................. 86 14150

[51] Int. Cl.$^4$ .................. H01J 31/50; H01J 40/14
[52] U.S. Cl. .................. 250/213 R; 250/327.2 R
[58] Field of Search ............. 250/213 R, 327.2 L, 250/327.2 R; 378/28, 29, 99; 355/3 R; 358/311

[56] References Cited

U.S. PATENT DOCUMENTS

| | | | |
|---|---|---|---|
| 3,394,737 | 7/1983 | Komaki et al. | 250/327.2 R |
| 3,790,785 | 2/1974 | Paolini et al. | 250/213 R |
| 4,021,106 | 5/1977 | Gaynor et al. | 355/3 R |
| 4,132,893 | 1/1979 | Moraw et al. | 378/29 |
| 4,176,275 | 11/1979 | Korn et al. | 250/213 R |
| 4,268,750 | 5/1981 | Cowart | 250/315.1 |
| 4,288,264 | 9/1981 | Haque | 156/67 |
| 4,467,351 | 8/1984 | Wang | 378/99 |
| 4,508,966 | 4/1985 | Oberschmid et al. | 250/327.2 L |
| 4,535,468 | 8/1985 | Kempter | 378/28 |

Primary Examiner—David C. Nelms
Assistant Examiner—William L. Oen
Attorney, Agent, or Firm—Oblon, Fisher, Spivak, McClelland & Maier

[57] ABSTRACT

An embodiment of the electrostatic image sensor comprises essentially two electrodes, one layer of photoconductive material and one dielectric layer comprising an electret designed to polarize the photoconductive layer without requiring a voltage source during the recording of an image. During a recording stage, a change-over switch short-circuits the electrodes. Photocarriers are released by the X-rays that have crossed an object to be radiographed. The said photocarriers move in the electrical field created by the electret and tend to cancel the electrical field at the interface between the two layers. During a reading stage, the change-over switch connects the electrodes to the inputs of a current amplifer while a light beam scans the layer of photoconductive material. The photocarriers move and completely cancel the electrical field at every point of the interface between the two layers. The current detected by the amplifier makes it possible to display an image on a cathode ray tube. During an initialization stage, the layer of photoconductive material is brought to the neutral state by means of a direct voltage generator connected to the electrodes by the change-over switch.

9 Claims, 3 Drawing Sheets

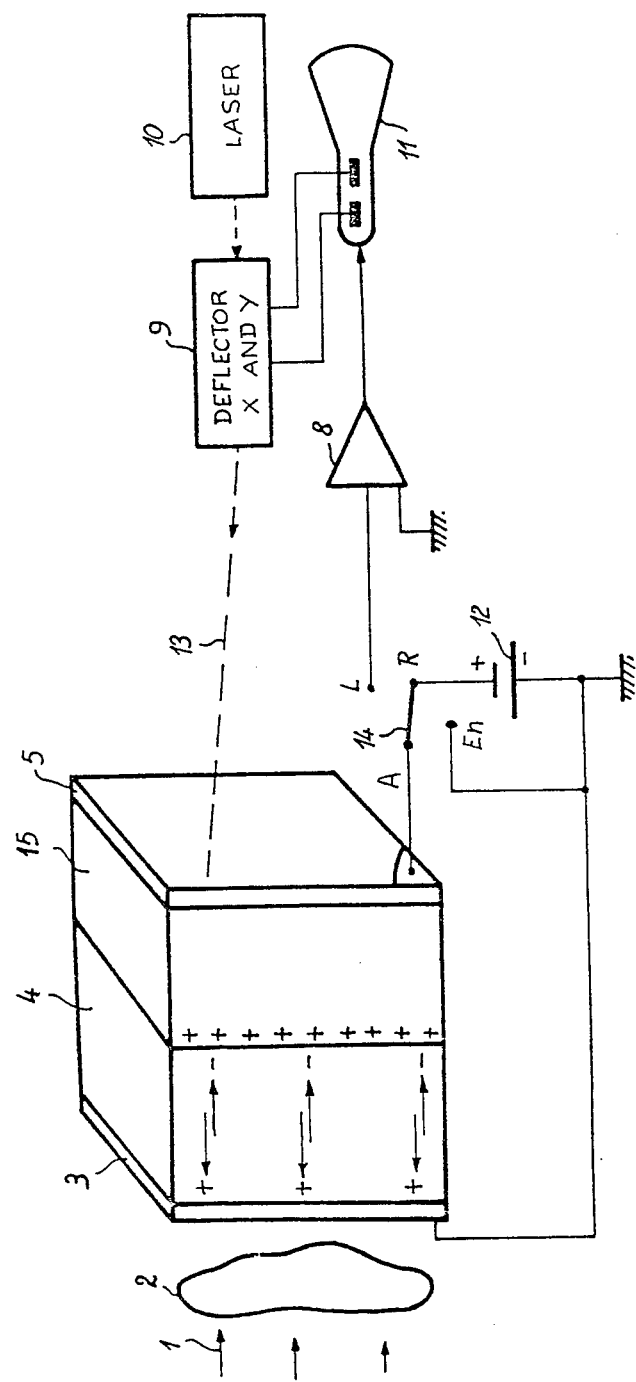

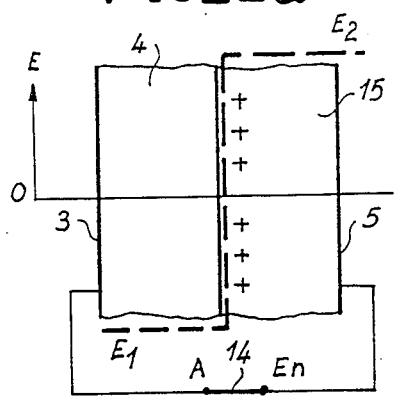
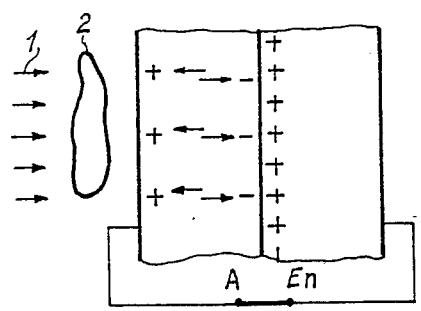
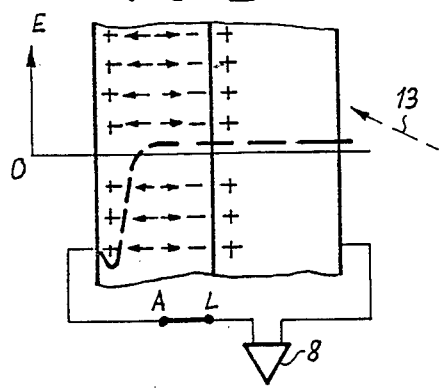
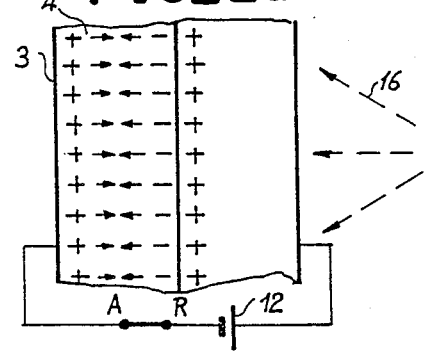
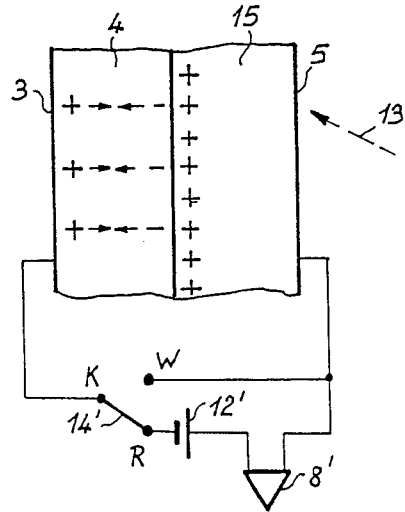

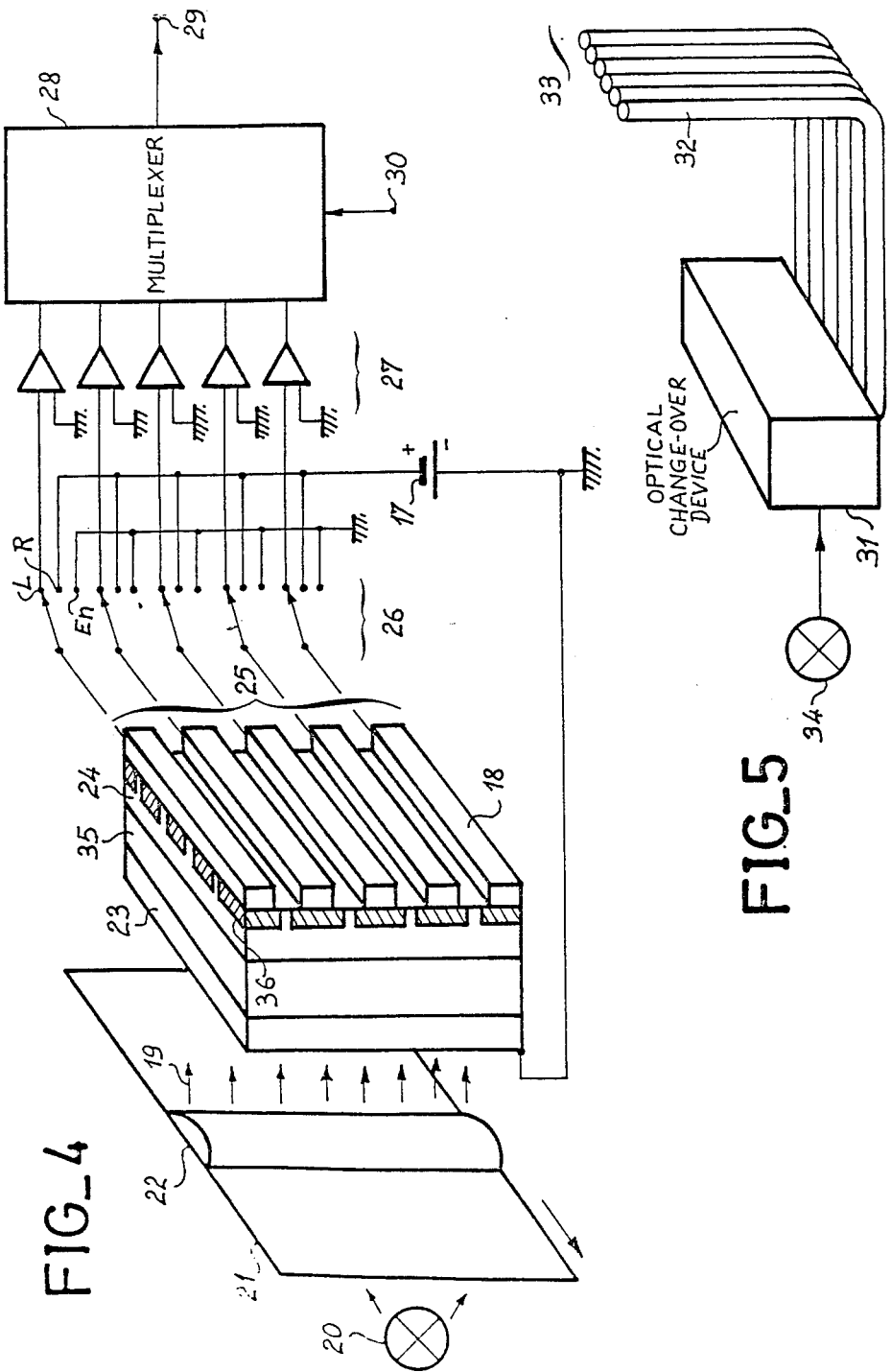

ELECTROSTATIC IMAGE SENSOR HAVING AN ELECTRET WHICH POLARIZES A PHOTOCONDUCTIVE LAYER

BACKGROUND OF THE INVENTION

1. Field of the Invention

The invention pertains to an electro-static image sensor which gives an electrical signal that represents an image carried by non-visible radiation, for example, X-rays. In this type of image sensor a latent image is recorded, in the form of a spatial distribution of space charge, at the interface between a layer of photoconductive material and a layer of dielectric material. Then, this latent image is read point by point by compensating this space charge with photocarriers released by a pencil of light scanning the layer of photoconductive material. Two electrodes are used to receive an electrical signal. Storage at the interface between the photoconductive layer and the dielectric layer enables an image to be analyzed and processed at any pace, irrespective of the time for which the sensor is exposed to radiation.

2. Description of the Prior Art

In the prior art, the American U.S. Pat. No. 4,446,365, for example, describes the making of an image sensor comprising a layer of dielectric comprising a sheet of polyethylene terephtalate (PETP marketed as Mylar by DUPONT DE NEMOURS), a layer of amorphous selenium and two electrodes between which the dielectric layer and the selenium layer are located. During the recording of a latent image, a voltage of 2000 volts is applied to the electrodes in order to polarize the layer of photoconductive material. During the stage for reading the latent image, the two electrodes are connected to the input of a current amplifier which converts the intensity of the discharging current of the layer of photoconductive material, under the effect of light scanning, into a video signal which can be observed on a cathode tube.

This type of image sensor can be used, in particular, instead of photographic films in conventional installations for radiological examination. In an application of this type, the sensor is placed in a conventional installation, in the place of the photographic film, to record a latent image. Then, it is placed in a reading device to restore a picture in a cathode tube. The latent image persists for a few hours: thus the picture can be read and recorded at two different places if need be.

The image sensor of the known type has the disadvantage of requiring a high voltage source during the recording stage. This implies a modification of conventional radiology installations to incorporate the high voltage source into them.

An object of the invention is to enable a latent image to be recorded in the sensor without a voltage source being needed for it.

An object of the invention is an electrostatic image sensor with the same structure as the device of the known type, but one where the layer of dielectric material comprises an electret designed to polarize the layer of photoconductive material electrostatically.

SUMMARY OF THE INVENTION

According to the invention, an electrostatic image sensor comprises:

A layer of a material which is photoconductive when it is illuminated by a radiation carrying an image to be sensed or by visible light;

A layer of dielectric material comprising an electret, to polarize the layer photoconductive material;

Two electrodes, the layers mentioned above being interposed between these two electrodes;

Light scanning means to successively illuminate each portion of the layer of photoconductive material along a pre-determined path by means of a beam of visible light;

Means coupled to the two above-mentioned electrodes to give electrical signals representing the intensity of the discharging current of the layer of photoconductive material during light scanning.

The invention will be better understood and other of its details will emerge from the following description and the appended figures.

BRIEF DESCRIPTION OF THE DRAWINGS

FIG. 1 is a block diagram of an embodiment of the image sensor according to the invention;

FIGS. 2a to 2d illustrate the functioning of this embodiment;

FIG. 3 illustrates the functioning of this embodiment in another mode of use;

FIGS. 4 and 5 represent two alternative embodiments of the sensor according to the invention.

DESCRIPTION OF THE PREFERRED EMBODIMENT

The embodiment shown in FIG. 1 comprises essentially a layer 15 consisting of an electret, a layer 4 consisting of photoconductive material, a first electrode 3 and a second electrode 5 located on either side of superimposed layers 15 and 4, a change-over switch 14 with one circuit and three positions, a current amplifier 8, a light beam deflector 9, a laser 10, a cathode ray tube 11 and a direct voltage generator 12.

In this example, an X-ray beam 1 is projected through an object 2 to be radiographed. The X-rays that have crossed the object 2 are received by the layer 4 through the electrode 3 which is transparent to X-rays. The electrode 3 is connected to a reference potential while the electrode 5 is connected to a common point A of the change-over switch 14. The change-over switch 14 has a first position, marked En, in which the common point A is connected to the reference potential, a second position, marked L, in which the common point A is connected to an input of the current amplifier 8, and a third position, marked R, in which the common point A is connected to the positive terminal of the generator 12. The negative terminal of the generator 12 is connected to the reference potential, as is a second input of the current amplifier 8. An output of the current amplifier 8 is connected to the cathode tube 1 Wehnelt cylinder.

As with image sensors of the prior art, the functioning of the sensor according to the invention comprises a stage for the recording of a latent image, during which the change-over switch 14 is in the position En, and a stage for the reading of the latent image, during which the change-over switch 14 is in the position L.

According to a first alternative mode of use of the sensor according to the invention, there is provision for a third stage of functioning in which the sensor can be initialized to record a new image. During this initializing stage, the change-over switch 14 is in the position R.

During the reading stage, the layer 4 is scanned by a light beam 13 through the second electrode 5 and the layer 15 which are transparent. The laser 10 gives the light beam 13 which is deflected by the deflector 9 along two perpendicular directions marked X and Y. This deflector 9 has two outputs coupled respectively to vertical deflection and horizontal deflection electrodes of the cathode tube 11 so as to control a synchronous scanning in the cathode tube 11. The deflector 9 is of a conventional make, within the scope of the specialist.

The electret forming the layer 15 is a dielectric film in which positive or negative charges have been implanted at a shallow depth beneath one of the surfaces of this film. For example, in polytetrafluorethylene, these charges can be implanted at a depth of about 1 micron beneath the surface. This implantation may be considered to be permanent because the conductivity of this dielectric is practically zero. The side of the electret carrying the charges is the one in contact with the layer 4. Since these charges are very near the surface of the dielectric, they may be considered to be trapped at its surface. The photoconductive material behaves like a dielectric when in darkness. By contrast, pairs of photocarriers are released when this material is illuminated, either by X-rays or by visible light rays.

The FIGS. 2a to 2d illustrate the functioning of this embodiment. In FIG. 2a, the change-over switch 14 is in the position En, to enable the sensor to record an image. The electrical field E in the layer of the electret 15 has a uniform value $E_2$ and the electrical field in the layer of photoconductive material 4 has a uniform value $E_1$. The curve drawn with dashes represents the algebraic value of the electrical field through the image sensor. If the electret and the photoconductive material have equal dielectric constants and equal thicknesses, the values $E_1$ and $E_2$ are equal in terms of absolute value and have opposite signs.

FIG. 2b shows the functioning during the recording stage proper, i.e. when X-rays 1 cross an object 2 and then release photocarriers in the layer 4. At each point of the layer 4, the number of photocarriers released is proportionate to the dose of X-rays received. These photocarriers are moved under the effect of the electrical field $E_1$ created by the electret 15 in the layer 4, and, in turn, they create an electrical field which tends to cancel the electrical field $E_1$. If the dose of X-rays received is sufficient, the photocarriers are moved in a number sufficient to cancel the electrical field $E_1$ at the interface of the layers 4 and 15, by creating an exactly opposite field. Since the dose of X-rays is not uniform and since it is smaller than that corresponding to the said sufficient number of photocarriers, a latent image is stored in the form of a non-uniform distribution of the electrical field in the layer 4 and in the layer 15.

FIG. 2c represents the functioning of the system during the reading stage. The change-over switch 14 is in the position L in order to connect the electrodes 3 and 5 to the inputs of the current amplifier 8 which behaves like a short-circuit. The light beam 13 successively scans each point of the layer 4 and its light intensity is chosen so as to make it possible to release a number of photocarriers which is sufficient, after the movement of the said photocarriers, to completely cancel the electrical field $E_1$ at every point of the interface of the layers 4 and 15. The photocarriers created by the light beam 13 thus achieve saturation of the image sensor by complementing the movement of the charges already brought about by the X-rays. The flow of movement created by the light scanning is represented by an electrical current detected by the amplifier 8, and therefore gives a sequential reading signal of the latent image. This current, therefore, represents the latent image in the negative. When saturation is reached, the electrical field is close to zero at the interface between the layers 14 and 15 as shown by the graph of E in FIG. 2c, and the movement of the photocarriers then stops.

If the charge per unit area of electret is $s_0$, the saturation of this unit area is reached if a charge $s_0/2$ has flowed from one electrode to the other, passing through the external circuit closed by the change-over switch 14. During the recording of an image, a charge $xs_0$ is moved towards the electrode 3, the value of coefficient x ranging between 0 and $\frac{1}{2}$. During the reading stage, the same unit area is brought to saturation, engendering a current of charges with a value $(\frac{1}{2}-x)s_0$ which constitutes the reading signal detected by the amplifier 8.

FIG. 2d represents the stage of initializing the sensor, in other words the stage in which the latent image is erased. In this stage, each point of the layer 4 is illuminated with a uniform illumination 16 sufficient to release a number of photocarriers which equal to at least the sum of the photocarriers released during the recording stage and the reading stage of the latent image. The initializing stage further consists of applying an electrical field enabling these photocarriers to be moved so as to bring the entire layer 4 to the neutral state. The electrical field is given by the voltage generator 12, its voltage being chosen as being equal, in absolute values, to the voltage (called the equivalent voltage) of the electret which is the potential created by the said electret at the interface of the layers 4 and 15. The field created by the generator 8 makes a charge $s_0/2$ flow for each unit area of the sensor. When the photocarriers have finished moving, the resultant field at the interface of the layers 4 and 15 is zero and the material of the layer 4 is uniformly neutral. The uniform illumination 16 can be given by a scanning which is similar to the scanning of the beam 13 used for reading but has an intensity or duration greater than that of the scanning by the beam 13. The change-over switch 14 is then reset in the position En, as shown in FIG. 2a, pending the recording of a new image.

FIG. 3 shows an alternative embodiment of an image sensor according to the invention, and illustrates the functioning of this embodiment during the reading and initializing stage, these two stages being merged with each other. This alternative embodiment comprises electrodes 3, 5, and layers 4 and 15 which are unchanged. By contrast, the electrical circuit connected to the electrodes 3 and 5 is different from that described earlier. A change-over switch 14' with one circuit and two positions has a common point K connected to the electrode 3.

During the recording stage (not shown) the change-over switch 14' is in a first position, marked W, in which it directly connects the electrode 3 to the electrode 5. During the reading and initializing stage, the change-over switch 14' is in a second position marked R in which it connects the electrode 3 to the positive terminal of a direct voltage generator 12'. The negative terminal 12' is connected to the electrode 5 by two inputs of a current amplifier 8' similar to the current amplifier 8 in the preceding embodiment.

During the reading stage, a light beam 13 scans the layer 4 after crossing the electrode 5 and the electret 15.

The beam 13 is given by means similar to those of the preceding embodiment. The photocarriers released in the layer 4 by the beam 13 move under the effect of the electrical field created by the generator 12' and are recombined, thus making it possible to bring the layer 4 to a neutral state corresponding to the initial state of the sensor. During the movement of the photocarriers, a current flows through the generator 12' and the current amplifier 8', directly representing the dose of X-rays absorbed at the point which is being illuminated by the beam 13. The value of this current is complementary to that obtained during the reading in the embodiment described previously.

The voltage of the generator 8' is chosen as being equal to the voltage called the equivalent voltage of the electret, the said equivalent voltage being equal to its surface potential at the interface of the layers 4 and 15. Thus, the resultant electrical field is zero in the layer 4 near the interface of the layers 4 and 15 when the layer 4 returns to neutral state.

In this example, the layer 4 comprises a layer of amorphous selenium with a thickness of 160 microns. The layer 15 consists of a PTFE electret with a thickness of 60 microns.

The photoconductive material is chosen so as to enable layers with large areas (of several square decimeters) to be manufactured and so that it efficiently absorbs X-rays as well as the light rays of the reading operation. It must be noted that the thickness of the photoconductive material should be relatively broad for the efficient absorption of X-rays. This thickness should preferably be greater than the inverse of the absorption coefficient of the material for the wavelength of the X-rays to be absorbed.

Furthermore, the reading signal is maximum when the electrical capacity of the photoconductive layer is equal to that of the dielectric layer. The thicknesses of these two layers 4 and 15 should therefore be chosen with these conditions taken into account.

In this example, the electrode 3 is an ohmic electrode comprising a layer of evaporated aluminium with a thickness of about 0.1 micron and the electrode 5 is a transparent ohmic electrode comprising a layer of tin oxide of 0.01 micron.

The layer 15 is preferably made of PTFE or one of its copolymers PTFE-FEP and PTGE-PFA, with the formulae:

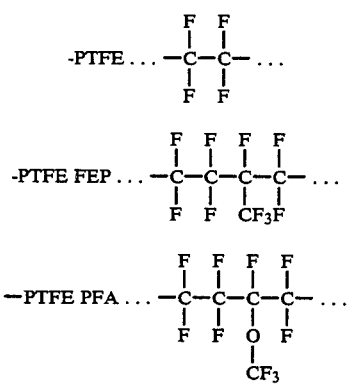

Similarly, polypropylene can be used under the same conditions.

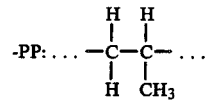

The electret is discharged conventionally by the Corona method which, in its simplest version, consists in placing the dielectric on a plane at zero potential and in placing one or more pins, carried to a few kilovolts, at a few centimeters above the upper side. A more precise control of the charge consists in interposing, between the dielectric and the pins, a grid taken to a potential equal to the desired equivalent voltage of the electret. The charging time is a few minutes, in air, at ambient temperature.

A first alternative embodiment makes it possible to reduce the capacity of layer 4 of photoconductive material. This alternative consists in dividing one of the electrodes 3 or 5, into several electrically insulated parts, each connected to an independent current amplifier. A second alternative makes it possible to amplify the reading signal by a conventional method in which a reverse-polarized PN junction is used, this junction being formed inside the photoconductive material of the layer 4.

The FIG. 4 represents a block diagram of a third embodiment of the sensor according to the invention, comprising both its characteristics simultaneously. This embodiment comprises essentially a layer 24 of photoconductive material, a layer 35 of electret material, a first electrode 23 and a second electrode 25, located on either side of the layers 24 and 35, the electrode 25 being divided into several identical strips 18. For greater clarity, the number of strips 18 represented in the figure is limited to 5 whereas, in practice, it may be 1,024 for example. The layer 24 is made of N-type doped amorphous selenium and comprises, on the electrode 25 side, diffusions 36 of P-type dopant. These diffusions 36 are square-shaped and aligned parallel to the strips 18. In the example shown in the FIG. 2, five series of diffusions 36 are respectively aligned to face five strips 18. Each diffusion 36 constitutes a PN junction independent of its neighbors.

The division of the electrode 25 into several strips 18 causes the capacitance of the layer 24 to be diminished. It also enables efficient parallel reading on each of the strips 18, thus making it possible to reduce the reading speed at each point of the sensor while, at the same time, maintaining the same total duration for the recording stage. This reduction in speed makes it possible to reduce the pass-band of the current amplifier to be connected to each of the strips 18. This reduction in the pass-band reduces the power of the noise received by this current amplifier and, consequently, increases the detecting capacity of the sensor. A reduction of the capacitance by a factor of 1000 is accomplished by splitting up the electrode 24 into a thousand identical strips 18, and a reduction of the pass-band by a factor of 1000 multiplies the detecting capability by a factor of 1000. The detecting capability of a sensor of this type is then about a few X-photons per pixel.

In this example, the reading is done on the side of the electrode 23 which receives the X-ray radiation. For greater clarity, this radiation and the object that it crosses are not shown in the figure. The reading is done by light rays 19, projected on the electrode 23 along a line perpendicular to the direction of the strips 18 comprising the electrode 25. These light rays are given by a source 20 of coherent light and are focused by a cylindrical lens 22 surrounded by an opaque screen 21. The opaque screen 21 and the lens 22 are moved, at a regular speed, in a plane parallel to the plane of the electrode 23 so as to give a regular scanning of the said electrode.

Each strip 18 of the electrode 25 is electrically connected to the common point of a change-over switch with one circuit and three positions, marked En, R and L, for it fulfils the same functions as the change-over switch 14 of the first embodiment shown in FIG. 1. The set 26 of all the change-over switches respectively associated with the strips 18 of the electrode 25 makes it possible to connect all the strips 18 to the electrode 23 during the latent-image recording stage; it makes it possible to connect them respectively to the inputs of a set 27 of current amplifiers during the reading stage; and it makes it possible to connect all the strips 18 to the positive terminal of the generator 17 during the initialization stage.

Another alternative embodiment may comprise a set 26 of change-over switches with only two positions, similar to the change-over switch 14' of FIG. 3.

The current amplifiers 27 have outputs connected respectively to the inputs of a multiplexer 28. The said multiplexer 28 has an output connected to an output terminal 29 to give the current values measured at the strips 18 sequentially. The multiplexer 28 also has a control input connected to a terminal 30 to receive a control signal given, for example, by a calculating device designed to process the images collected by the image sensor. This calculating device also controls the movement of the opaque screen 21 carrying the lens 22, to synchronize the read-scanning and image-processing operations.

Other read-scanning devices can be used, for example a controlled lateral-scattering optic fiber set near the electrode 23, perpendicular to the direction of the strips 18 of the electrode 25, and moved in a plane parallel to the electrode 23.

FIG. 5 further depicts another alternative of the optic scanning device. It comprises a sheet 33 of controlled lateral-scattering optic fibers, with its fibers 32 perpendicular to the direction of the strips 18 and attached to the surface of one of the electrodes of the sensor, for example the electrode 23 in FIG. 4. An optical change-over device 31 connects a light source 34 successively to each of the fibers 32 constituting the sheet 33. For greater clarity, the electrode 23, the layers 24 and 35 and the electrode 25 have not been shown in this FIG. 5. They are identical to those of the embodiment shown in FIG. 4, as is the case with the change-over switches 26, the amplifiers 27 and the multiplexer 28.

In other embodiments, the X-ray illumination can be provided on the same side as the light scanning by the beam 19, through the electrode 23.

The layer 25, comprising an electret, may be located, if necessary, on the side at which the X-rays arrive, for the electret absorbs no X-rays and therefore cannot be discharged by these X-rays.

The invention can be applied especially to image sensors for radiological examinations, but also to sensors for light or gamma radiation.

What is claimed is:

1. An electrostatic image sensor, comprising:
a layer of photoconductive material, said layer of photoconductive material becoming photoconductive when illuminated and behaving as a dielectric when in darkness;
a layer of dielectric material, comprising an electret, for polarizing said layer of photoconductive material, said layer of dielectric material connecting to said layer of photoconductive material;
a first electrode connecting to said layer of dielectric material and a second electrode connecting to said layer of photoconductive material;
light scanning means for successively illuminating each portion of said layer of photoconductive material, along a predetermined path, with a beam of visible light;
electrical signal generating means for generating an electrical signal corresponding to an intensity level of discharge current from said layer of photoconductive material when said layer of photoconductive material is illuminated by said light scanning means, said electrical signal generating means connecting to said first electrode and said second electrode;
initializing means for erasing a latent image recorded in said layer of photoconductive material, said initializing means connecting to said first electrode.

2. An image sensor according to claim 1, wherein:
said second electrode is divided into parallel and identical strips;
the light scanning means projecting a perpendicular line of light through said first electrode and on to the parallel and identical strips, said perpendicular line being moved along the parallel and identical strips;
the electrical signal generating means generates several electrical signals in parallel, respectively representing the intensity level of the discharge current from the layer of photoconductive material connected to each of the parallel and identical strips.

3. An image sensor according to claim 2 wherein:
the light scanning means comprise a layer of controlled lateral-scattering optic fibers, applied against one of the electrodes comprising said first electrode and said second electrode, said fibers being perpendicular to the parallel and identical strips and coupled to a light source by an optical switching-over device.

4. An image sensor device according to the claim 1 wherein:
the thickness of the layer of photoconductive material and the thickness of the layer of dielectric material are such that the capacitance of these two layers have similar values.

5. An image sensor according to the claim 1 wherein:
the layer of photoconductive material consists of amorphous selenium.

6. An image sensor according to claim 1 wherein:
the layer of photoconductive material comprises a PN junction.

7. An image sensor according to the claim 6, wherein:
the PN junction is split up into several electrically independent PN junctions.

8. An image sensor according to claim 1 wherein said electrical generating means comprises:
a voltage generator with a voltage equal to a potential created by an electret at an interface of said layer of said photoconductive material and said layer of dielectric material;
a current amplifier;

a change-over switch to connect said first electrode to an input of said current amplifier during a stage for reading the latent image, and said change-over switch connecting said first electrode and said second electrode to said voltage generator during an initialization stage.

9. An image sensor according to claim 1, wherein said electrical signal generating means comprises:

a voltage generator with a voltage equal to a potential created by an electret at an interface of said layer of photoconductive material and said layer of dielectric material;

a current amplifier; and a change-over switch, said change-over switch serially connecting said first electrode to said current amplifier during a reading stage, serially connecting said voltage generator to said first electrode during a re-initialization stage, and serially connecting said first electrode to said second electrode during a recording stage.

* * * * *